US008014165B2

(12) United States Patent
Hamner et al.

(10) Patent No.: US 8,014,165 B2
(45) Date of Patent: Sep. 6, 2011

(54) PANEL MOUNT CONNECTOR

(75) Inventors: Richard Elof Hamner, Hummelstown, PA (US); Matthew Richard McAlonis, Elizabethtown, PA (US)

(73) Assignee: Tyco Electronics Corporation, Middletown, PA (US)

( * ) Notice: Subject to any disclaimer, the term of this patent is extended or adjusted under 35 U.S.C. 154(b) by 1033 days.

(21) Appl. No.: 11/888,936

(22) Filed: Aug. 3, 2007

(65) Prior Publication Data

US 2009/0034217 A1 Feb. 5, 2009

(51) Int. Cl.
*H05K 1/14* (2006.01)

(52) U.S. Cl. .......................... 361/785; 361/769; 361/776

(58) Field of Classification Search .................. 361/769, 361/785, 776; 439/632, 78
See application file for complete search history.

(56) References Cited

U.S. PATENT DOCUMENTS 3,611,249 A * 10/1971 Lovrenich ....................... 439/78
5,154,634 A * 10/1992 Brown et al. ................. 439/553
5,556,308 A * 9/1996 Brown et al. ................. 439/746
5,772,469 A 6/1998 Polgar et al.
5,984,721 A 11/1999 Self, Jr. et al.
6,450,834 B1 9/2002 Polgar et al.
6,634,616 B2 10/2003 Belknap
7,090,533 B1 8/2006 Houck et al.

OTHER PUBLICATIONS

SD Memory Card Connectors, 2005 by Tyco Electronics Corporation, 6 pgs.
Smart Card Reader 0.76mm; Panel Mount with Cable Blade Switch, Normally Closed, C-595497, Published 2005; 2 pgs.

* cited by examiner

*Primary Examiner* — Tuan T Dinh
*Assistant Examiner* — Steven Sawyer

(57) ABSTRACT

A connector for mounting to a panel is provided that includes a housing that has a front edge configured to be located proximate an opening in the panel. The connector also includes a tab that extends from the front edge of the housing where the tab is oriented to engage an outer surface of the panel. A spring member also extends from the front edge of the housing and is positioned to engage an inner surface of the panel. The spring member is flexible toward and away from the tab.

20 Claims, 10 Drawing Sheets

PANEL MOUNT CONNECTOR

BACKGROUND OF THE INVENTION

This invention relates generally to a connector assembly used in an electrical system, and more particularly to a connector assembly that is configured to receive an electronic module while mounted onto a panel.

Many portable electronic devices allow a user to store information on a small memory card. For example, many digital cameras include a slot for inserting and removing a memory card, such as a SD flash memory card. In some electronic devices, a slot is made through a side panel of the electronic device for inserting the memory card. A housing within the electronic device receives the memory card. The housing not only holds the memory card, but may also protect or shield the memory card and electronic device from unwanted electrostatic discharge. The information may be transferred between the memory card and the electronic device by using, for example, an Insulation Displacement Crimp (IDC) interconnecting assembly attached to the end of the housing.

As electronic devices become increasingly small, the size of the circuit board may be reduced. Further, the market may demand that more features or capabilities be built into the electronic device, which may require additional electrical components attached to the circuit board. Thus, the configuration and arrangement of the electrical components on the circuit board becomes increasingly important. One problem with the conventional connector system is that the housing is directly mounted to the circuit board. Because the housing is usually rectangular and positioned flatly onto the circuit board, the housing blocks a large amount of the circuit board's usable surface area.

Another problem faced by those who design electronic devices is that the electrical components may operate poorly or be damaged in heat. To combat this, designers may arrange the electrical components on the circuit board in a manner that is conducive to airflow. Thus, it is desirable to have additional methods of mounting the housing.

Thus, there is a need to improve the design of the connector assembly system in electronic devices in order to overcome the present deficiencies while at the same time protecting the electronic device from electrostatic discharge.

BRIEF DESCRIPTION OF THE INVENTION

In one embodiment, a connector is provided for mounting to a panel that includes a housing that has a front edge configured to be located proximate an opening in the panel. The connector also includes a tab that extends from the front edge of the housing where the tab is oriented to engage an outer surface of the panel. A spring member also extends from the front edge of the housing and is positioned to engage an inner surface of the panel. The spring member is flexible toward and away from the tab.

Optionally, the spring member may have a flex portion that flexes toward and away from the tab. The flex portion can extend away from the edge at an angle. Also, the spring member may include a flex portion that has a width less than a width of a notch in the panel opening. The flex portion flexes into the notch when the housing is mounted onto the panel.

In another embodiment, a connector assembly for connecting an electronic module to an electronic device is provided that includes an interconnecting element coupled to the electronic device. The connector assembly also includes a connector that includes a housing having a front edge configured to be located proximate an opening in the panel. The connector also includes a tab that extends from the front edge of the housing where the tab is oriented to engage an outer surface of the panel. A spring member also extends from the front edge of the housing and is positioned to engage an inner surface of the panel. The spring member is flexible toward and away from the tab.

In another embodiment, a connector for mounting to a panel is provided that includes a housing having a front edge located proximate to an opening in the panel. A tab extends from the front edge of the housing and is oriented to engage an outer surface of the panel. A spring member also extends from the front edge of the housing and has fins that project from sides of the spring member. The fins are oriented to engage an edge surface of the notch when the connector is mounted to the panel. The spring member is flexible toward and away from the tab.

Optionally, the connector may include a tail from which the fins project. The tail and fins may have a width greater than a width of the notch in the panel opening. The fins flex toward each other when the fins engage the edge surface.

DETAILED DESCRIPTION OF THE INVENTION

Figure 1:
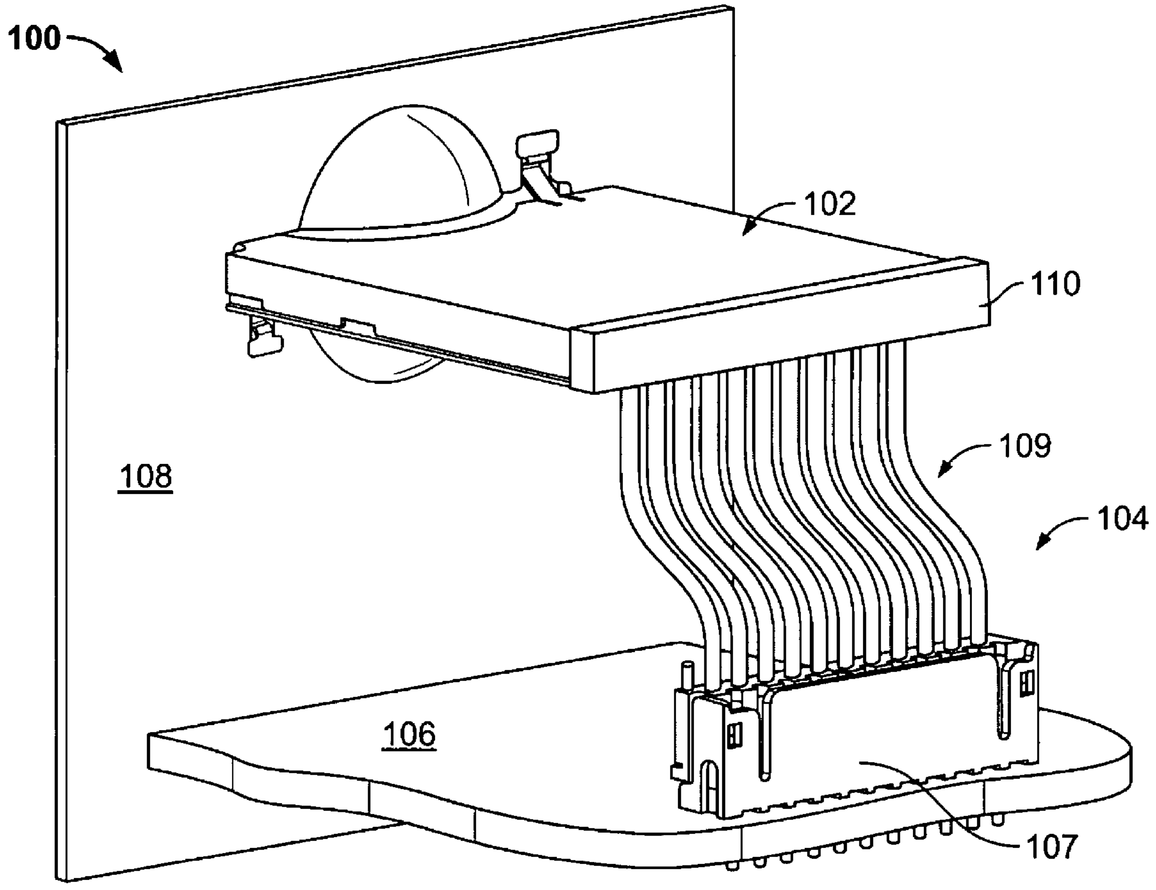
FIG. 1 is a rear-perspective view of a connector assembly formed in accordance with an embodiment of the present invention and mounted to a panel.

FIG. 1 is a rear-perspective view of a connector assembly 100 mounted to a panel 108. The panel 108 may be, for example, a panel that houses an electronic device, such as a computing device or a digital camera. The connector assembly 100 includes a housing 102 coupled to a receptacle assembly 104 that may be mounted to a circuit board 106. The receptacle assembly 104 shown in FIG. 1 can include an Insulation Displacement Crimp (IDC) interconnecting element 110 that connects to a mounted post header 107 through wires 109. Although element 110 in FIG. 1 is an IDC type of interconnecting element, element 110 may be any type of connector or type of electrical element that transmits power and/or electrical signals to the electronic device. For example, element 110 may be an insert-molded element or element 110 may be wires soldered to an end of the connector. Connector assembly 100, in one embodiment, receives a memory card (e.g., a SD flash memory card) facilitating an electrical connection between the memory card (not shown) and circuit board 106 of the electronic device. In other embodiments, connector assembly 100 receives another type of electrical storage device or any electrical element that transmits power and/or electrical signals to the electronic device.

Figure 2:
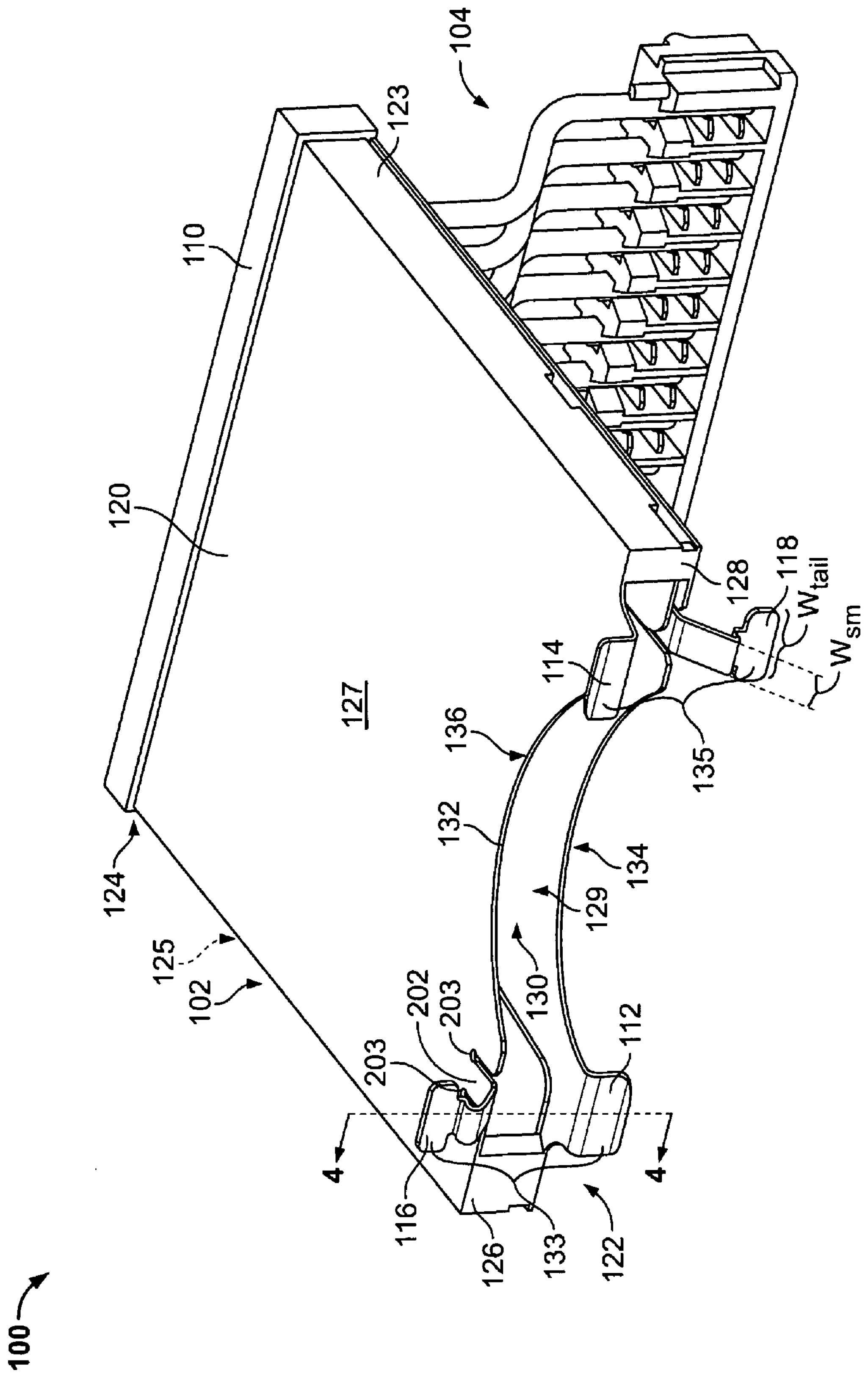
FIG. 2 is a front-perspective view of the connector assembly shown in FIG. 1.

As shown in FIG. 2, connector assembly 100 has a front end 122, a back end 124 that couples to IDC interconnecting element 110, opposing sidewalls 123, 125, a top wall 127, and a bottom wall (not shown). Housing 102 may have a rectangularly-shaped body 120 that extends between front end 122, back end 124, and sidewalls 123, 125. Alternatively, housing 102 may be other geometric shapes provided that housing 102 can engage panel 108 (FIG. 1) as discussed in more detail below. A cavity 129 extends through body 120 in a front-to-rear direction and has a cavity opening 130 proximate to front end 122. In one embodiment, cavity opening 130 opens onto panel 108 and is configured to receive an electronic module for electrically connecting the module to an electronic device. A front edge 132 at least partially circumscribes the cavity opening 130. Front edge 132 may form recessed portions 134, 136 by extending rearward into body 120. Recessed portions 134, 136 assist a user in gripping an electronic module, e.g., memory card, while inserting or removing the electronic module. In one embodiment, body 120 includes support walls 126 and 128 that form a portion of front end 122. Support walls 126 and 128 may add structural integrity to housing 102 and also partially define the cavity opening 130.

In one embodiment, housing 102 includes forward tabs 112 and 114 and spring members 116 and 118. Forward tabs 112, 114 and spring members 116, 118 cooperate in mounting housing 102 onto panel 108 and will be discussed in more detail below. As can be seen in FIG. 2, tab 114 and spring member 118 are adjacent to each other and proximate to sidewall 123. Tab 112 and member 116 are adjacent to each other and proximate sidewall 125. As such, tab 114 and spring member 118 form a tab-member pair 135 with forward tab 114 extending from top wall 127, and tab 112 and spring member 116 form a tab-member pair 133 with spring member 116 extending from top wall 127. In this embodiment, tab-member pairs 133, 135 have an inverted relationship with respect to each other. The inverted relationship allows housing 102 to be rotated into mounting position (discussed in further detail below). Although FIG. 2 illustrates the inverted relationship between tab-member pairs 133, 135, alternative embodiments of housing 102 may not have an inverted arrangement of the tab-member pairs. Further, other embodiments may only include one tab-member pair. For example, a wider tab may stretch along top wall 127 and oppose a wider spring member across cavity opening 130.

Figure 3:
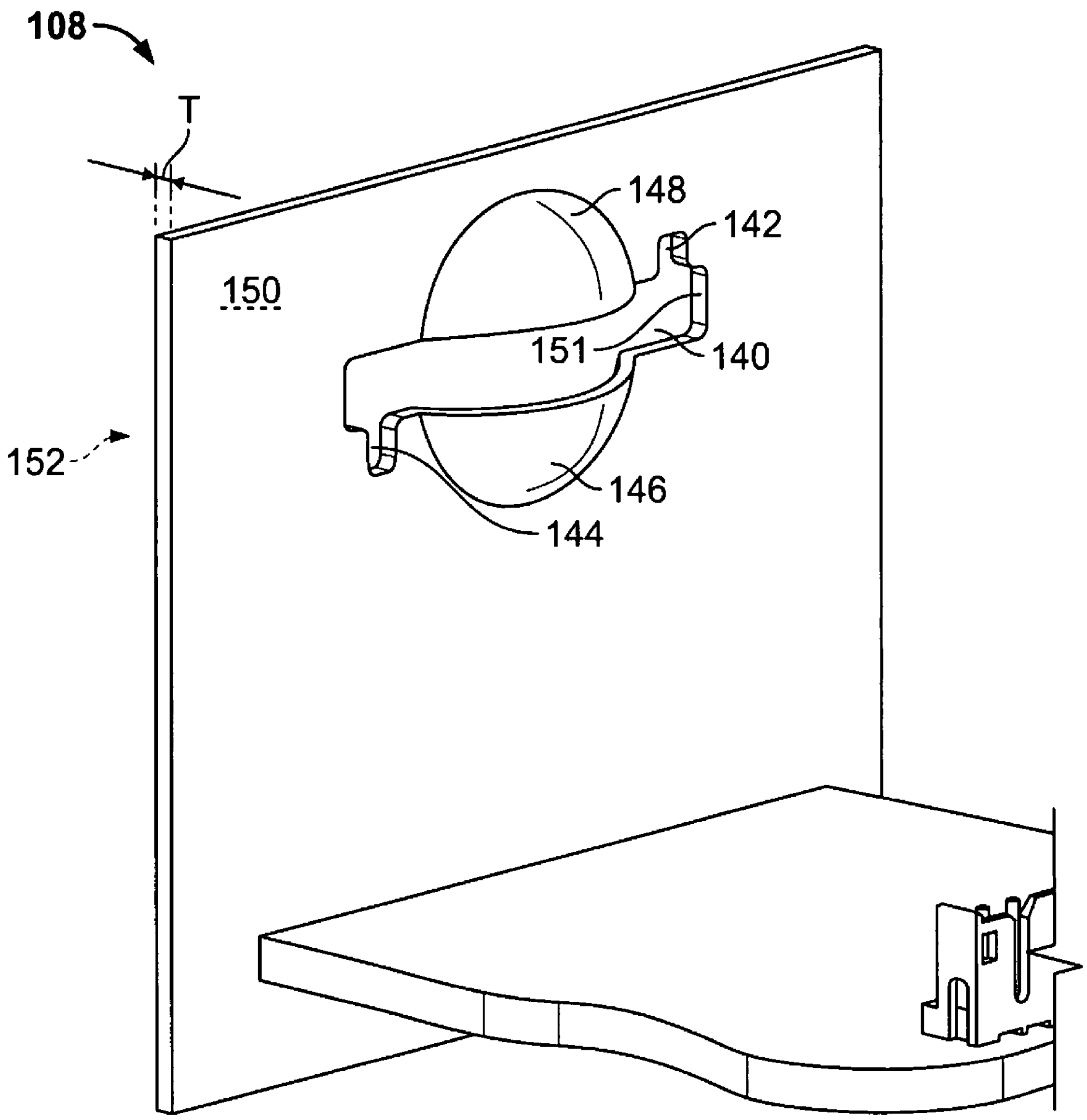
FIG. 3 is a perspective view of the panel shown in FIG. 1.

FIG. 3 is a rear-perspective view of panel 108. Panel 108 has opposite inner and outer surfaces 150 and 152, respectively, that define a thickness T therebetween. A panel opening 140 extends through panel 108 from the outer surface 152 to the inner surface 150. Generally, panel opening 140 is shaped such that the electronic module may be advanced through panel opening 140 to form an electrical connection via connector assembly 100 (FIG. 2). More specifically, an edge surface 151 circumscribes the shape of panel opening 140, which, in one embodiment, may be shaped substantially similarly to cavity opening 130 (FIG. 2). For example, panel opening 140 can be substantially rectangular with notches 142 and 144 projecting outward. Notches 142 and 144 are configured to receive a portion of spring members 116, 118 (FIG. 2), respectively, when housing 102 (FIG. 2) is mounted onto panel 108. Thus, with respect to the embodiment shown in FIG. 3, notches 142 and 144 are positioned diagonally across panel opening 140. Alternatively, other embodiments of housing 102 may require different shapes and/or positions of notches 142 and 144.

Also shown in FIG. 3, panel 108 may have indentations 146 and 148 that at least partially surround panel opening 140. Indentations 146, 148 can complement recessed portions 134, 136 (FIG. 2) and assist a user in gripping an electronic module, e.g., memory card, while inserting or removing the electronic module.

Figure 4:
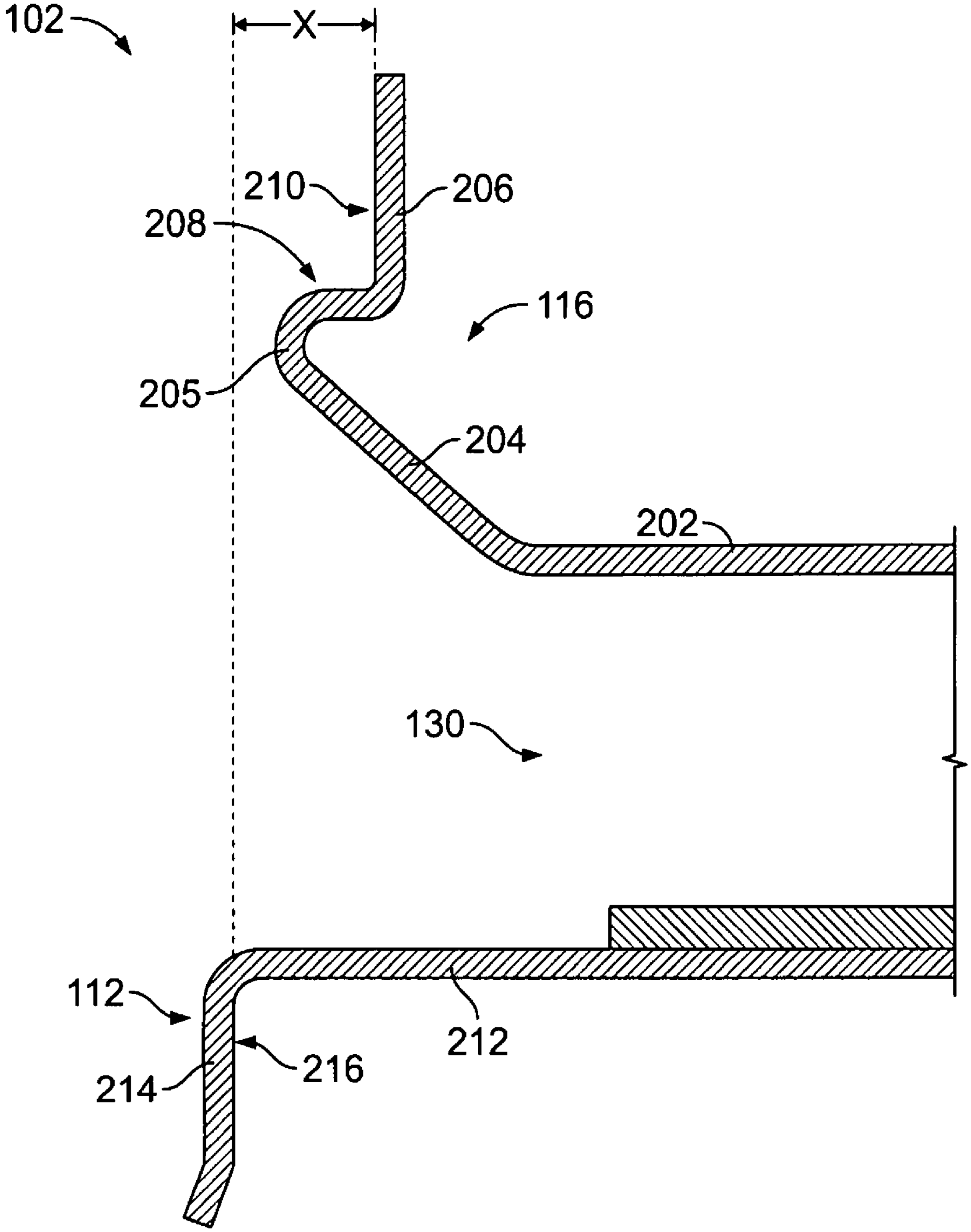
FIG. 4 is a cross-sectional view of the connector assembly taken along line 4-4 in FIG. 2.

FIG. 4 is a cross-sectional view of housing 102 taken along line 4-4 in FIG. 2 before housing 102 is engaged to panel 108. When not engaged, spring member 116 and forward tab 112 are in an unbiased or undeflected position. In one embodiment, spring member 116 includes a beam 202 that extends from body 120 (not shown in FIG. 4). As shown in FIG. 2, beam 202 may be defined by slits 203 that project into body 120 from front edge 132. Spring member 116 may also include a flex portion 204 that extends from beam 202 at an angle away from cavity opening 130. In one embodiment, flex portion 204 forms a knee 205 having an outer surface that curves sharply back toward housing 102 such that knee 205 forms an offset portion 208 that is, in one embodiment, substantially parallel with beam 202. In one embodiment, spring member 116 includes a tail 206 that extends from flex portion 204 or knee 205 and has an outer surface 210. When spring member 116 is in an unbiased or undeflected position, tail 206 and beam 202 are substantially perpendicular with respect to each other. Flex portion 204 and/or knee 205 has a width $W_{SM}$ (shown in FIG. 2).

Forward tab 112 is adjacent to spring member 116 on an opposing side of cavity opening 130. In one embodiment, as shown in FIG. 2, forward tab 112 diametrically opposes spring member 116 across cavity opening 130. Forward tab 112 includes a platform 212 that extends outwardly from front edge 132 (FIG. 2) and includes a lip 214. As shown in FIG. 4, platform 212 may extend straight from front edge 132 without forming an angle between platform 212 and body 120 (FIG. 2). In one embodiment, lip 214 is substantially perpendicular to platform 212 and has an inner surface 216 that contacts outer surface 152 (FIG. 3) of panel 108 when spring member 116 is engaged. As shown in FIG. 4, a plane formed by outer surface 210 of tail 206 and a plane formed by inner surface 216 of lip 214 are separated by a distance X. In one embodiment, distance X is about equal to or slightly less than thickness T of panel 108 (shown in FIG. 3).

Spring member 116 may be configured to flex toward and away from tab 112. In other embodiments, spring member 116 is configured to flex toward cavity opening 130. Although forward tab 112 may be capable of some flexing, tab 112 is more rigid than spring member 116. In operation, spring member 116 and forward tab 112 cooperate to create opposing forces to grip panel 108 (FIG. 3). More specifically, spring member 116 contacts panel inner surface 150 (FIG. 3) and forward tab 112 contacts panel outer surface 152 (FIG. 3).

Although the previous discussion relates specifically to spring member 116 and forward tab 112 shown in FIG. 4, spring member 118 and forward tab 114 (both shown in FIG. 2) may have similar parts and functions.

Figure 5:
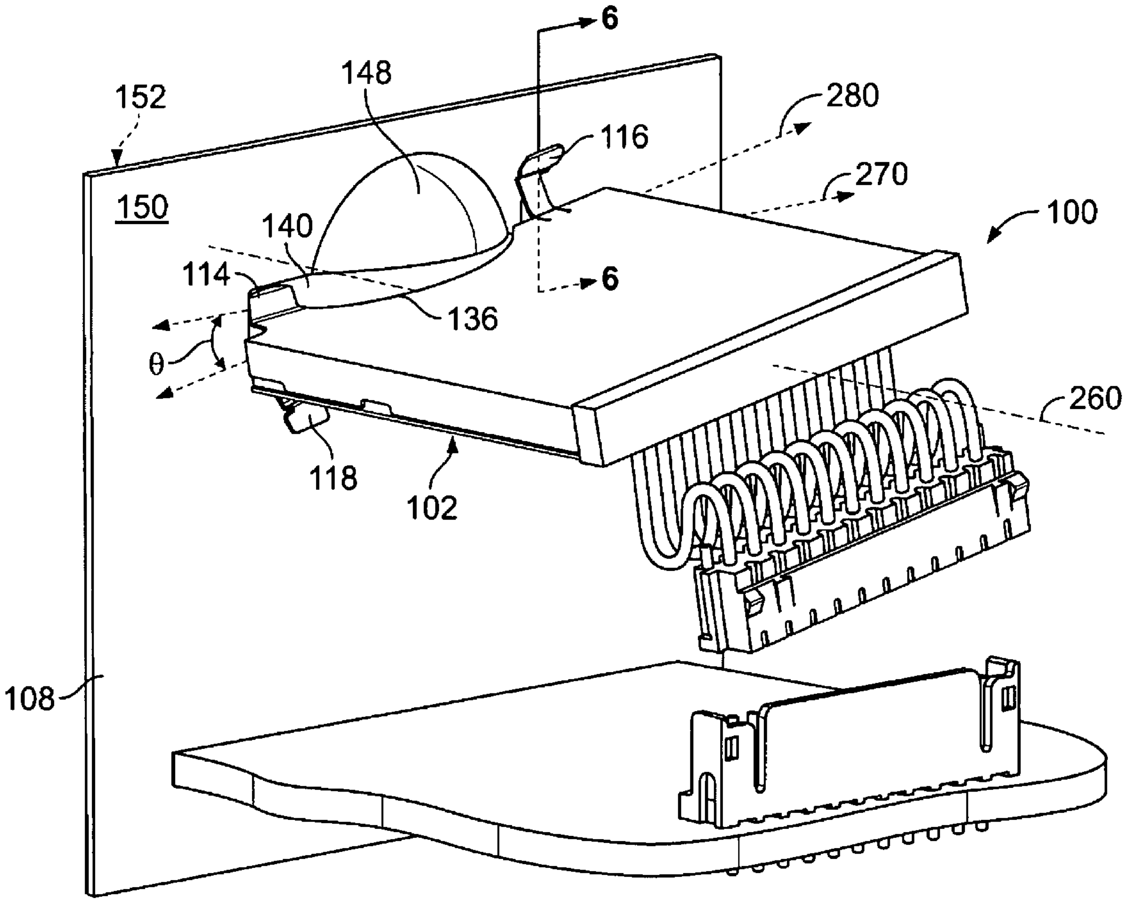
FIG. 5 is a rear-perspective view of the connector assembly of FIG. 1 before the connector assembly is mounted onto the panel.
Figure 6:
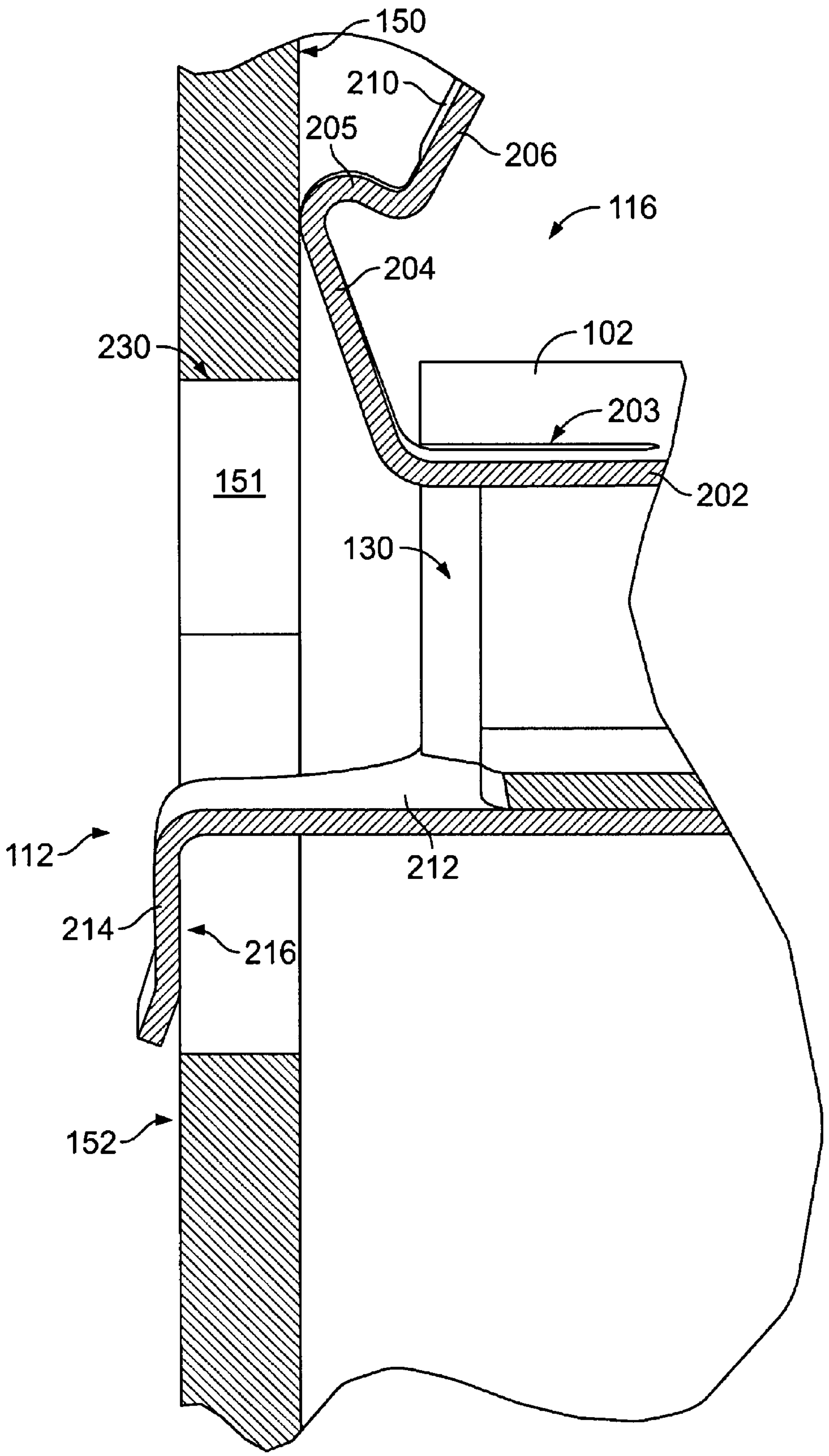
FIG. 6 is a cross-sectional view of the connector assembly taken along line 6-6 in FIG. 5.
Figure 7:
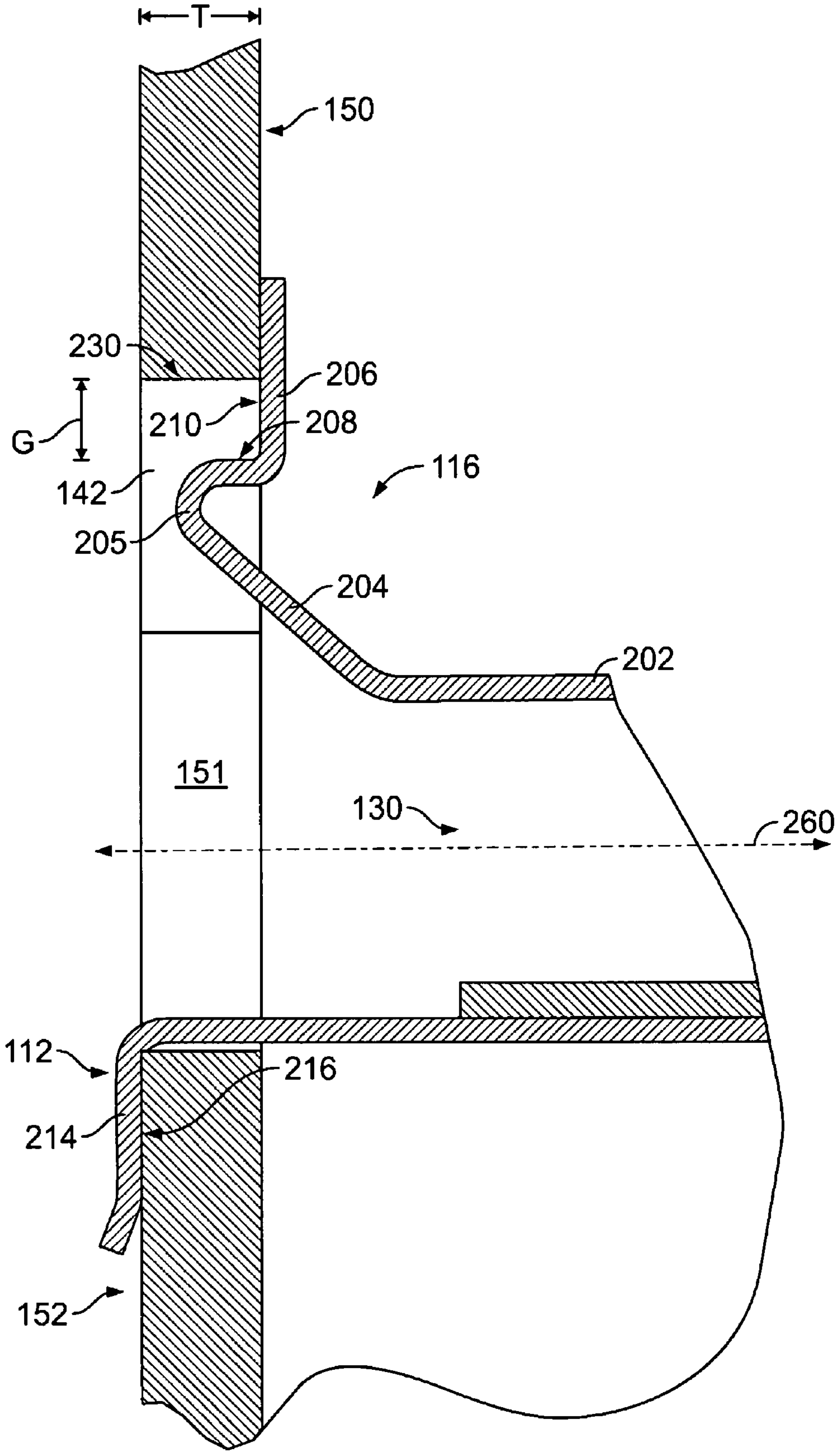
FIG. 7 is a cross-sectional view of the connector assembly shown in FIG. 6 when the connector assembly is mounted onto the panel.

FIGS. 5-7 illustrate the steps for mounting connector assembly 100 onto panel 108. As shown in FIG. 5, housing 102 can be rotated about a central axis 260 that extends through the center of housing 102 in a front-to-rear direction. A horizontal line 270 stretches through the center of panel opening 140 in a side-to-side direction and a pitch line 280 stretches through the center of cavity opening 130 (shown in FIG. 2) in a side-to-side direction. In FIG. 5, lines 270 and 280 are substantially perpendicular to axis 260. To mount connector assembly 100 or, more specifically, housing 102 onto panel 108, housing 102 is rotated about central axis 260 such that an angle θ is formed between pitch line 280 and horizontal line 270. In this orientation, forward tab 114 and forward tab 112 (not shown in FIG. 5) can be inserted through panel opening 140. As tabs 112 and 114 advance through panel opening 140, spring members 116 and 118 press against inner surface 150 and deflect away from tabs 112 and 114, respectively. Once the inner surface 216 (FIG. 4) of tabs 112 and 114 have cleared the plane formed by outer surface 152, housing 102 may be rotated in the opposite direction until cavity opening 130 and panel opening 140 become substantially aligned (e.g., as in FIG. 1).

As shown in FIG. 6, while housing 102 is being rotated into the aligned position, spring members 116 and 118 (not shown in FIG. 6) are in a deflected or biased position and are exerting a force against inner surface 150. FIG. 7 illustrates that when knee 205 clears a notch edge 230 spring member 116 snaps into notch 142. In this engaged position, outer surface 210 of spring member 116 is in contact with and is exerting a force against inner surface 150. Further, inner surface 216 of tab 112 is in contact with outer surface 152. As such, the force exerted by spring member 116 against inner surface 150 is countered by the force exerted by inner surface 216 against outer surface 152. Thus, adjacent spring member 116 and forward tab 112 cooperate to create opposing forces for gripping panel 108.

In one embodiment, spring member 116 is configured to at least partially fit into notch 142 when in the engaged position. As FIG. 7 illustrates, when spring member 116 is engaged a gap G may be formed between offset portion 208 and notch edge 230. Gap G may occur due to manufacturing considerations, e.g., to ensure that spring member 116 snaps into position when cavity opening 130 of housing 102 (FIG. 5) is aligned with panel opening 140 (shown in FIGS. 3 and 5). Likewise, width $W_{SM}$ (FIG. 2) of spring member 116 is slightly less than the width of notch 142 (FIG. 3). When spring member 116 is in the engaged position, the side edges of flex portion 204, knee 205, and/or offset portion 208 may contact edge surface 151, thus preventing housing 102 (shown in FIG. 2) from rotating and inadvertently disengaging from panel 108. In one embodiment, to further prevent rotation, the width $W_{tail}$ (shown in FIG. 2) may be adjusted to increase the amount of friction between tail 206 and panel 108.

As described above, panel 108 may have indentations 148 and 146 (all shown in FIG. 3) forming a finger recess that allows a user of the electronic device to grip, for example, a memory card inserted into the device. As such, the recessed portions 134 and 136 of housing 102 (all shown in FIG. 2) allow the tabs 112 and 114 (FIG. 2) to be inserted through the panel opening 140 (FIG. 3) when housing 102 is rotated about central axis 260 (FIG. 5) to form angle θ. More specifically, the advancement of housing 102 would be stopped by indentations 148 and 146 if the recessed portions 134 and 136 did not exist or were not configured appropriately. Once tabs 112 and 114 are inserted through panel opening 140, the recessed portions 134 and 136 are rotated around indentations 148 and 146 until spring members 116 and 118 (FIG. 2) snap into position. Thus, in one embodiment, the connector assembly 100 (FIG. 1) may be mounted to a panel that has a finger recess without using fasteners (e.g., screws) or like hardware.

Figure 8:
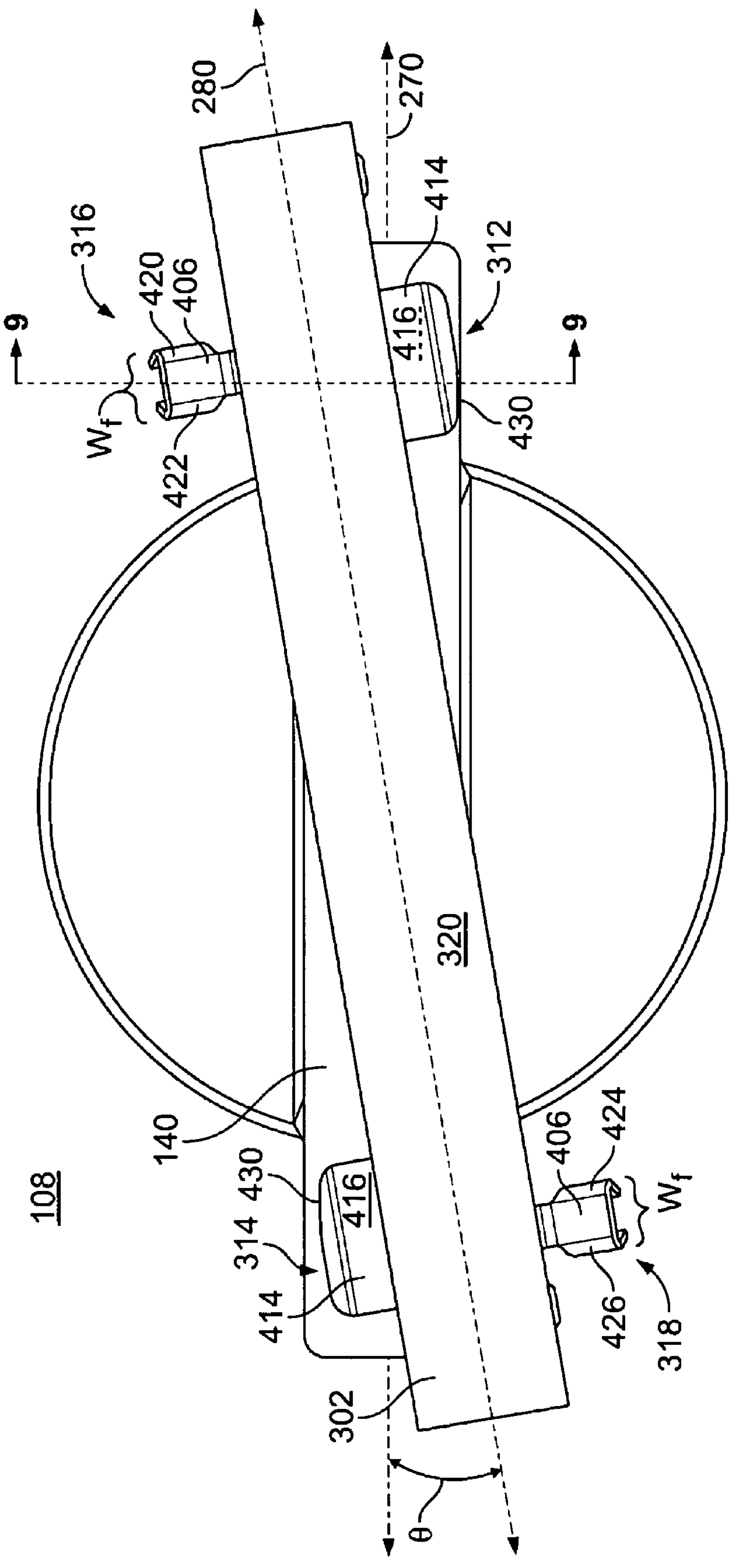
FIG. 8 is a rear view of a connector assembly formed in accordance with another embodiment of the present invention before the connector assembly is mounted to a panel.
Figure 9:
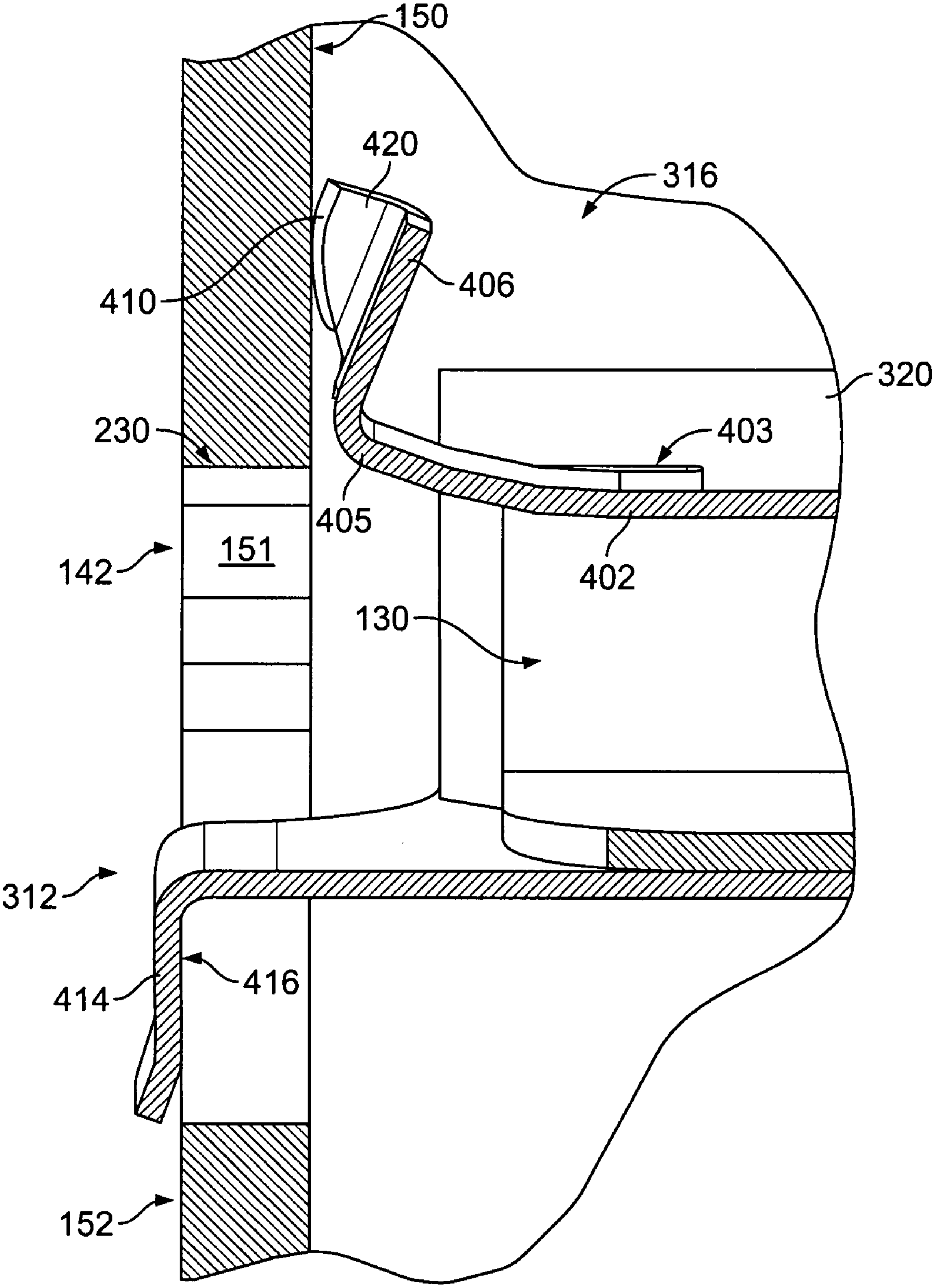
FIG. 9 is a cross-sectional view of the connector assembly taken along line 9-9 in FIG. 8.
Figure 10:
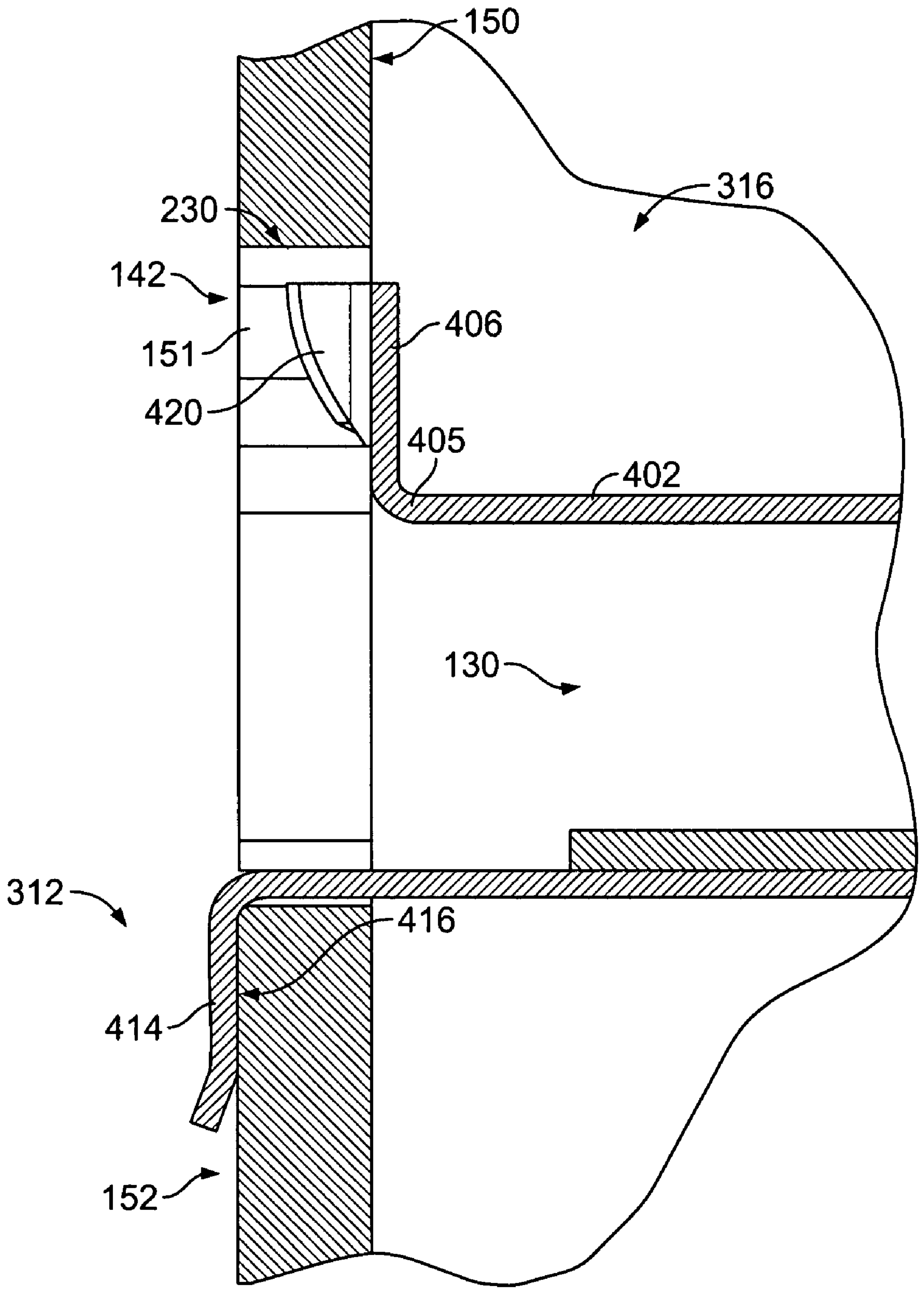
FIG. 10 is a cross-sectional view of the connector assembly shown in FIG. 9 mounted to the panel.

FIGS. 8-10 illustrate another embodiment formed in accordance with the present invention. FIG. 8 is a rear-view of a housing 302 in a rotated position with respect to panel opening 140. Housing 302 has a body 320, forward tabs 312, 314, and spring members 316, 318. Tabs 312 and 314 are similarly shaped and oriented as forward tabs 112 and 114 (FIG. 2) and include a lip 414 and an inner surface 416. In one embodiment, lip 414 may be shaped to have a tapered portion 430 that slightly lessens the degree of rotation necessary to advance tabs 312 and 314 through panel opening 140.

The spring members 316 and 318 have a beam 402 that extends into a flex portion 405, which forms a tail 406 (shown in FIGS. 9 and 10). Beam 402 may be defined by slits 403 (FIG. 9) that project into body 320. Flex portion 405 joins tail 406 and beam 402 and tail 406 and beam 402 are substantially perpendicular. In one embodiment, beam 402 and/or flex portion 405 are capable of flexing toward and away from tab 312. In an alternative embodiment, spring members 316 and 318 are similarly shaped and oriented as spring members 116 and 118 (FIG. 2).

The spring members 316 and 318 have fins 420, 422, and 424, 426, respectively, that project from the sides of tail 406 and extend in a rear-to-front direction. With reference to spring member 316, shown in FIGS. 8-10, fins 420 and 422 initially project outward with respect to tail 406 and then curve inward. As such, fins 420 and 422 effectively increase a width $W_f$ of tail 406. Fins 420 and 422 also have a fin edge 410 (FIG. 9). As can be seen in FIGS. 9 and 10, fin 420 sprouts from a base of tail 406 and grows larger to a top of tail 406. When housing 302 is rotated into the aligned position, such that cavity opening is aligned with panel opening 140, fin edge 410 makes slidable contact with inner surface 150. When the top of tail 406 clears notch edge 230, spring member 316 snaps into the engaged position. Width $W_f$ may be equal to or greater than the width of notch 142. In the engaged position, the outer surfaces of fins 420 and 422 are in contact with edge surface 151 of notch 142. Because $W_f$ is equal to or greater than the width of notch 142, fins 420 and 422 flex toward each other and spring member 316 exerts a force against edge surface 151. This force is similar to the force exerted by spring member 116 against surface 150 (FIG. 7) as discussed above. In one embodiment, as can be seen in FIG. 10, a portion of tail 406 does not project into notch 142.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector for mounting to a panel having a panel opening, the connector comprising:

a housing having a front edge configured to be located proximate to the panel opening, the housing having a cavity that is sized and shaped to receive an electronic module;

a receptacle assembly coupled to the housing, the receptacle assembly configured to electrically engage the electronic module when the electronic module is advanced through the panel opening and inserted into the cavity;

a tab extending from the front edge of the housing, the tab being oriented to engage an outer surface of the panel; and a spring member extending from the front edge of the housing, the spring member being positioned to engage an inner surface of the panel, the spring member being flexible toward and away from the tab;

wherein the inner and outer surfaces of the panel face in opposite directions and have a thickness of the panel extending therebetween, the tab pressing against the outer surface of the panel when the housing is mounted thereto, wherein the tab and the spring member provide opposing forces to grip the panel.

2. The connector in accordance with claim 1 wherein the spring member further comprises a flex portion that flexes toward and away from the tab, the flex portion extending away from the edge at an angle.

3. The connector in accordance with claim 1 wherein the spring member further comprises a flex portion having a width less than a width of a notch in the panel opening, wherein the flex portion flexes into the notch when the housing is mounted onto the panel.

4. The connector in accordance with claim 1 wherein the tab is a first tab and the spring member is a first spring member, the housing comprising a second tab and a second spring member, wherein the first spring member and the first tab have an inverted relationship with respect to the second spring member and the second tab, the first and second spring members being deflected away from the first and second tabs, respectively, when pressed against the inner surface during a mounting operation, the first and second tabs advancing through the panel opening and clearing the outer surface when the first and second spring members are deflected.

5. The connector in accordance with claim 1 wherein the tab is a first tab and the spring member is a first spring member, the housing comprising a second tab and a second spring member, wherein the first spring member and the first tab are positioned proximate a first sidewall of the housing and the second spring member and the second tab are positioned proximate an opposing second sidewall of the housing.

6. The connector in accordance with claim 1 wherein the spring member and the tab oppose each other across the panel opening.

7. The connector in accordance with claim 1 wherein the spring member is configured to be deflected away from the tab when the spring member is pressed against the inner surface during a mounting operation, the tab advancing through the panel opening and clearing the outer surface when the spring member is deflected.

8. The connector in accordance with claim 1 wherein the spring member comprises a flex portion that extends toward the panel into the panel opening and a tail that extends from the flex portion and out of the panel opening, the tail engaging the inner surface of the panel when the housing is mounted.

9. The connector in accordance with claim 1 wherein the housing comprises a plurality of sidewalls that define the cavity, the spring member and the tab extending from different sidewalls, the electronic module moving between said different sidewalls.

10. The connector in accordance with claim 1 wherein the front edge at least partially defines a cavity opening that provides access to the cavity, the panel and cavity openings aligning with each other when the housing is mounted to the panel.

11. A connector assembly for connecting an electronic module to an electronic device, the assembly comprising:

an interconnecting element configured to be coupled to the electronic device; and a connector coupled to the interconnecting element, the connector comprising:

a housing having a front edge configured to be located proximate an opening in a panel, the housing having a cavity that is sized and shaped to receive an electronic module, the interconnecting element being coupled to the housing, the interconnecting element configured to electrically engage the electronic module when the electronic module is advanced through the panel opening and inserted into the cavity;

a tab extending from the front edge of the housing, the tab being oriented to engage an outer surface of the panel; and a spring member extending from the front edge of the housing, the spring member being positioned to engage an inner surface of the panel, the spring member being flexible toward and away from the tab;

wherein the inner and outer surfaces of the panel face in opposite directions and have a thickness of the panel extending therebetween, the tab pressing against the outer surface of the panel when the housing is mounted thereto, wherein the tab and the spring member provide opposing forces to grip the panel.

12. The connector assembly in accordance with claim 11 wherein the spring member further comprises a flex portion that flexes toward and away from the tab, the flex portion extending away from the edge at an angle.

13. The connector assembly in accordance with claim 11 wherein the flex portion has a width less than a width of a notch in the panel opening, wherein the flex portion flexes into the notch when the housing is mounted onto the panel.

14. The connector assembly in accordance with claim 11 wherein the tab is a first tab and the spring member is a first spring member, the housing comprising a second tab and a second spring member, wherein the first spring member and the first tab have an inverted relationship with respect to the second spring member and the second tab.

15. The connector assembly in accordance with claim 11 wherein the tab is a first tab and the spring member is a first spring member, the housing comprising a second tab and a second spring member, wherein the first spring member and the first tab are positioned proximate a first sidewall of the housing and the second spring member and the second tab are positioned proximate an opposing second sidewall of the housing.

16. The connector assembly in accordance with claim 11 wherein the spring member and the tab oppose each other across the panel opening.

17. An electrical connector for mounting to a panel having a panel opening, the connector comprising:

a housing having a front edge configured to be located proximate to the panel opening, the housing having a cavity that is sized and shaped to receive an electronic module;

a receptacle assembly coupled to the housing, the receptacle assembly configured to electrically engage the electronic module when the electronic module is advanced through the panel opening and inserted into the cavity;

a tab extending from the front edge of the housing, the tab being oriented to engage an outer surface of the panel; and a spring member extending from the front edge of the housing, the spring member being positioned to engage an inner surface of the panel, the spring member being flexible toward and away from the tab;

wherein the front edge at least partially defines a cavity opening that provides access to the cavity, the panel and cavity openings aligning with each other when the housing is mounted to the panel.

18. The connector in accordance with claim 17 wherein the inner and outer surfaces of the panel face in opposite directions and have a thickness of the panel extending therebetween, the tab pressing against the outer surface of the panel when the housing is mounted thereto, wherein the tab and the spring member provide opposing forces to grip the panel.

19. The connector in accordance with claim 17 wherein the housing comprises a plurality of sidewalls that define the cavity, the spring member and the tab extending from different sidewalls, the electronic module moving between said different sidewalls.

20. The connector in accordance with claim 17 wherein the tab is a first tab and the spring member is a first spring member, the housing comprising a second tab and a second spring member, wherein the first spring member and the first tab have an inverted relationship with respect to the second spring member and the second tab, the first and second spring members being deflected away from the first and second tabs, respectively, when pressed against the inner surface during a mounting operation, the first and second tabs advancing through the panel opening and clearing the outer surface when the first and second spring members are deflected.

* * * * *